(12) United States Patent
Stephen

(10) Patent No.: US 10,516,246 B2
(45) Date of Patent: Dec. 24, 2019

(54) SPATIALLY-DISTRIBUTED GAIN ELEMENT SELF-PHASE-LOCKED, LASER APPARATUS AND METHOD

(71) Applicant: United States of America as represented by the Administrator of NASA, Washington, DC (US)

(72) Inventor: Mark A. Stephen, Catonsville, MD (US)

(73) Assignee: United States of America as represented by the Administrator of NASA, Washington, DC (US)

( * ) Notice: Subject to any disclaimer, the term of this patent is extended or adjusted under 35 U.S.C. 154(b) by 299 days.

(21) Appl. No.: 15/685,932

(22) Filed: Aug. 24, 2017

(65) Prior Publication Data
US 2019/0067894 A1 Feb. 28, 2019

(51) Int. Cl.
| | |
|---|---|
| *H01S 3/00* | (2006.01) |
| *G02B 27/12* | (2006.01) |
| *G02B 27/28* | (2006.01) |
| *H01S 5/00* | (2006.01) |
| *G02B 27/10* | (2006.01) |
| *G02B 27/14* | (2006.01) |
| *H01S 3/067* | (2006.01) |
| *G02B 5/18* | (2006.01) |
| *G02B 6/00* | (2006.01) |
| *H01S 3/16* | (2006.01) |
| *H01S 5/125* | (2006.01) |

(52) U.S. Cl.
CPC ............. *H01S 3/005* (2013.01); *G02B 6/00* (2013.01); *G02B 27/106* (2013.01); *G02B 27/1093* (2013.01); *G02B 27/123* (2013.01); *G02B 27/14* (2013.01); *G02B 27/283* (2013.01); *H01S 3/0071* (2013.01); *H01S 5/0057* (2013.01); *H01S 5/0071* (2013.01); *G02B 5/1857* (2013.01); *H01S 3/0675* (2013.01); *H01S 3/1618* (2013.01); *H01S 5/125* (2013.01)

(58) Field of Classification Search
CPC ....... H01S 3/005; H01S 3/0675; G02B 27/10; G02B 27/106; G02B 27/1093; G02B 27/123; G02B 27/14
See application file for complete search history.

(56) References Cited

U.S. PATENT DOCUMENTS

| | | | | |
|---|---|---|---|---|
| 5,691,989 | A * | 11/1997 | Rakuljic | G02B 5/32 359/15 |
| 7,346,085 | B1 * | 3/2008 | Rothenberg | G02B 27/0087 372/29.016 |

(Continued)

*Primary Examiner* — Eric L Bolda
(74) *Attorney, Agent, or Firm* — Christopher O. Edwards; Bryan A. Geurts

(57) ABSTRACT

The present invention is related to laser technology which enables efficient, passive, coherent beam combination from distributed gain sources. The present invention includes a novel architecture which coherently combines the power from multiple sources, and which adds considerable flexibility to laser gain materials for many applications. The novel architecture of the present invention combines two techniques: 1) beam splitting and combination; and 2) phase-locking (i.e., maintaining a common phase relationship between multiple beams), using reflective gratings. Thus, the present invention addresses important limitations in laser technology: efficiency, power scaling and wavelength selectivity.

16 Claims, 6 Drawing Sheets

(56) References Cited

U.S. PATENT DOCUMENTS 8,340,150 B2 * 12/2012 Volodin .................. H01S 5/065
 372/50.123
2014/0268314 A1 * 9/2014 Dueck ................ G02B 27/1093
 359/349

* cited by examiner

F₁ - LENSLET ARRAY FOCAL LENGTH
F₂ - FOURIER LENS FOCAL LENGTH

SPATIALLY-DISTRIBUTED GAIN ELEMENT SELF-PHASE-LOCKED, LASER APPARATUS AND METHOD

ORIGIN OF THE INVENTION

The invention described herein was made by an employee of the United States Government, and may be manufactured or used by or for the Government for governmental purposes without the payment of any royalties thereon or therefor.

BACKGROUND OF THE INVENTION

1. Field of the Invention

The present invention relates to laser technology which enables efficient, passive, coherent beam combination from distributed gain sources. The present invention includes a novel architecture which coherently combines the power from multiple sources, and which adds considerable flexibility to laser gain materials for many applications. The novel architecture of the present invention combines two techniques: 1) beam splitting and combination; and 2) phase-locking (i.e., maintaining a common phase relationship between multiple beams), using reflective gratings. Thus, the present invention addresses important engineering factors in laser technology: efficiency, power scaling and wavelength selectivity.

2. Description of the Related Art

High power, high efficiency, flexible laser sources are desired for many applications. The main limitation for many current gain material sources, including semiconductors and fibers, is power scaling the output due to excessive optical intensity, due to the confinement from the 2-dimensional (2-D) waveguide. Although the power can be increased by having multiple gain elements, combining the power efficiently into a single optical stream has not been effective to date. Phase-locking multiple sources to each other is one possibility, but doing so at optical frequencies is complex and relatively unstable, and the degree of difficulty increases nonlinearly with the number of sources.

Thus, a laser technology that will enable power-scaling using multiple distributed gain sources, and which includes an architecture which is widely applicable to almost any laser technology, but will have particular benefits for fiber and semiconductor gain media where power scaling is difficult, is desired.

SUMMARY OF THE INVENTION

The present invention relates to laser technology which enables efficient, passive, coherent beam combination from distributed gain sources. The present invention includes a novel architecture which coherently combines the power from multiple sources, and which adds considerable flexibility to laser gain materials for many applications.

In one embodiment, the present invention coherently combines the energy from spatially distributed gain sources, meaning a 1-dimensional (1-D) or 2-D array of optical gain elements, into a single spatial mode, narrow frequency laser beam. In one exemplary embodiment, the novel architecture of the present invention combines two techniques: 1) beam splitting and recombination; and 2) phase-locking (i.e., maintaining a common phase relationship between multiple beams), using reflective gratings. Thus, the present invention addresses the most important limitations in laser technology: efficiency, power scaling and wavelength selectivity.

In one embodiment, an optical apparatus includes: at least one energy source which emits a plurality of beams of light; at least one gain source and a reflective grating, the reflective grating which maintains a fixed phase relationship between the plurality of beams of light; and a plurality of optical elements which split the plurality of beams of light from the at least one reflective grating and recombine the plurality of beams of light, into a single spatial mode output laser beam; wherein the at least one reflective grating reflects the plurality of beams of light with the fixed phase relationship to the plurality of beams of light input from the at least one energy source, independent of a distance of the at least one reflective grating from the at least one energy source.

In one embodiment, the at least one reflective grating includes one of a volume Bragg grating recorded in a photo-thermo-refractive (PTR) glass, or a plurality of ytterbium (Yb)-doped gain fibers with integrated fiber Bragg gratings (FBGs), or at least one semiconductor diode with reflective grating.

In one embodiment, at least one array of lenslets allows the plurality of beams of light from the reflective grating to be split and phase-locked.

In one embodiment, the array of lenslets are one dimensional or two dimensional in configuration.

In one embodiment, the apparatus is a laser apparatus and the plurality of optical elements includes an output coupler.

In one embodiment, the apparatus is an amplifier apparatus and the plurality of optical elements includes a Faraday rotator and a polarizer.

In one embodiment, the energy source is a pump laser.

In one embodiment, the optical apparatus further includes a seed laser which provides energy to the polarizer.

In one embodiment, a method of increasing an output of a laser beam, includes: emitting a plurality of laser beams of light from at least one energy source; maintaining a fixed phase relationship between the plurality of beams of light using at least one gain source and a reflective grating; and splitting the plurality of beams of light from the at least one reflective grating and recombining the plurality of beams of light using a plurality of optical elements, into a single spatial mode output laser beam; wherein the at least one reflective grating reflects the plurality of beams of light with the fixed phase relationship to the plurality of beams of light input from the at least one energy source, independent of a distance of the at least one reflective grating from the at least one energy source.

In one embodiment, the method of increasing an output of a laser beam further includes: splitting and phase-locking the plurality of beams of light from the at least one reflective grating, using at least one array of lenslets.

In one embodiment, the plurality of optical elements includes an output coupler of a laser apparatus.

In one embodiment, the plurality of optical elements includes a Faraday rotator and a polarizer of an amplifier apparatus.

In one embodiment, the method of increasing an output of a laser beam further includes: providing energy to the polarizer using a seed laser.

Thus, has been outlined, some features consistent with the present invention in order that the detailed description thereof that follows may be better understood, and in order that the present contribution to the art may be better appreciated. There are, of course, additional features consistent with the present invention that will be described below and which will form the subject matter of the claims appended hereto.

In this respect, before explaining at least one embodiment consistent with the present invention in detail, it is to be understood that the invention is not limited in its application to the details of construction and to the arrangements of the components set forth in the following description or illustrated in the drawings. Methods and apparatuses consistent with the present invention are capable of other embodiments and of being practiced and carried out in various ways. Also, it is to be understood that the phraseology and terminology employed herein, as well as the abstract included below, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the methods and apparatuses consistent with the present invention.

DESCRIPTION OF THE INVENTION

The present invention relates to laser technology which enables efficient, passive, coherent beam combination from distributed gain sources. The present invention includes a novel architecture which coherently combines the power from multiple sources, and which adds considerable flexibility to laser gain materials for many applications.

In one embodiment, the present invention coherently combines the energy from spatially distributed gain sources, meaning a 1-dimensional (1-D) or 2-D array of optical gain elements, into a single spatial mode, narrow frequency laser beam. In one exemplary embodiment, the novel architecture of the present invention combines two techniques: 1) beam splitting and recombination; and 2) phase-locking (i.e., maintaining a common phase relationship between multiple beams), using reflective gratings. Thus, the present invention addresses the most important limitations in laser technology: efficiency, power scaling and wavelength selectivity.

One of ordinary skill in the art would recognize that the first technique, regarding actual beam splitting and recombination, can be performed in various different ways to achieve the claimed features of the present invention.

As an exemplary embodiment, an interferometer 100 (see FIG. 1) is shown, having a gain source (i.e., doped fibers, laser crystal, semiconductor diodes, etc.), such as multiple ytterbium (Yb)-doped gain fibers with integrated fiber Bragg gratings (FBGs) 101a, 101b. In one exemplary embodiment, an anti-reflection coating is applied to the front facets of the fibers 101a, 101b, which are mounted in an array configuration.

Figure 1:
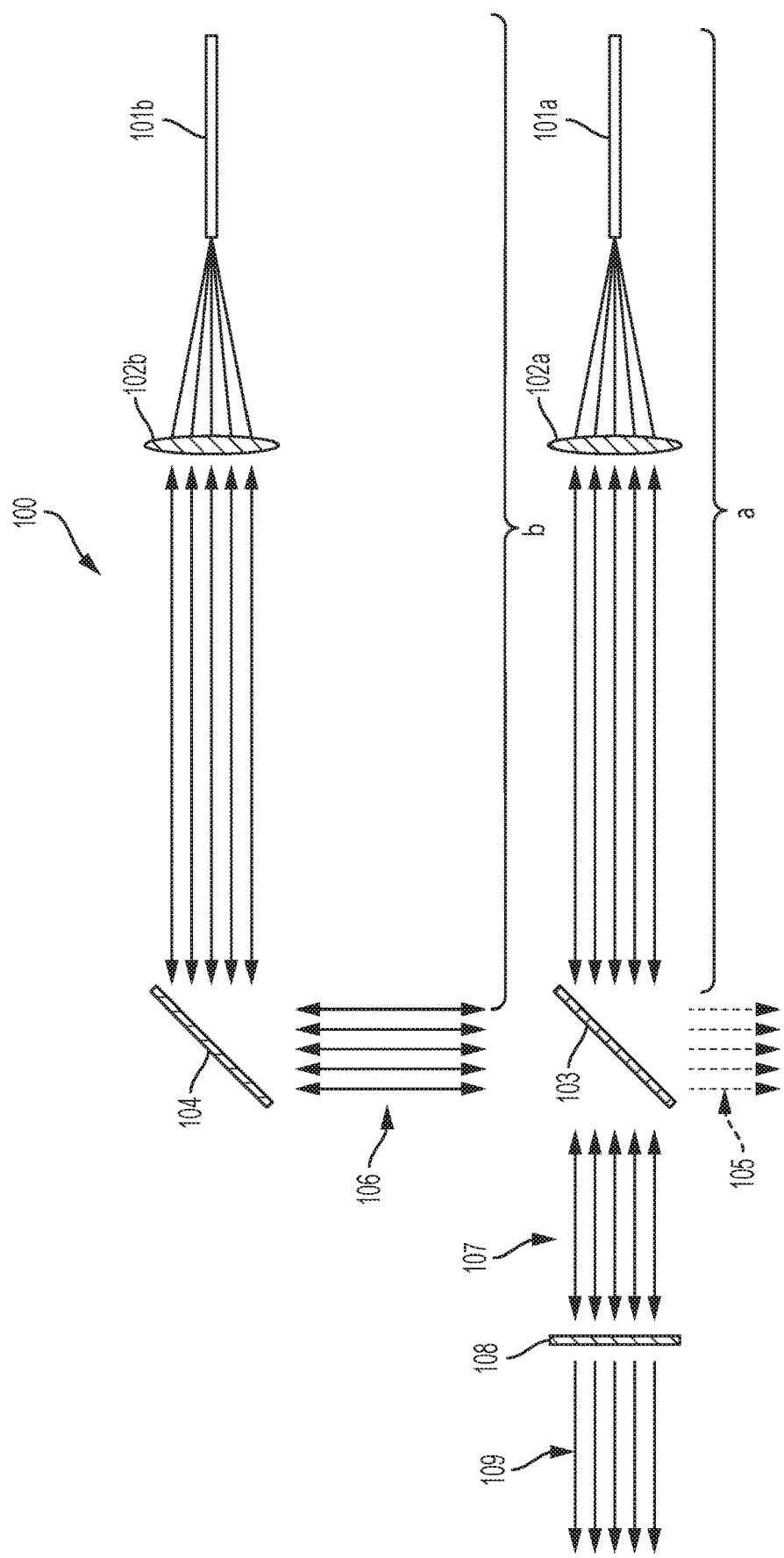
FIG. 1 shows a schematic drawing of an interferometer configuration, according to one embodiment consistent with the present invention.

In the exemplary embodiment of FIG. 1, light beams from the FBGs 101a, 101b proceed through lenses 102a, 102b, respectively. The light beams from lens 102a impact a 50% beam splitter 103, where light beams are transmitted through the beam splitter 103 as beams 107, and reflected out of the apparatus as beams 105. Due to destructive interference with the beams from 102b, no net optical power is contained in beams 105.

Light beams from lens 102b are reflected at mirror 104, and impact beam splitter 103, before being reflected from the beam splitter 103 and joining the transmitted beams from lens 102a as high output beams 107. The reflected beams 106 from mirror 104 that are transmitted through 103 destructively interfere with the beams from lens 102a, which are reflected at beam splitter 103, and which exit the apparatus as beams 105. No losses are created at beam splitter 103 in the output beams 105.

The high output beams 107 are directed to output coupler 108. Some light exits the array as a single spatial mode beam 109 with high power, while some light is reflected from 108 to circulate in the optical cavity. Accordingly, the present configuration provides a novel distributed-gain laser cavity that can make dramatic improvements in laser performance and flexibility.

In the exemplary embodiment of FIG. 1, the FGBs 101a, 101b are operated at the short wavelength band edge (sigma=+Kappa) of the filter, where light 107 at this wavelength reflected from interferometer arm "b" and transmitted from interferometer arm "a" will interfere constructively, regardless of the relative optical path lengths to the FBGs 101a, 101b. The FBGs should have the same short wavelength band edge to accomplish the above results. Thus, as shown in FIG. 1, the present configuration is exploited for coherent beam combination (recombination).

In the exemplary embodiment of FIG. 1, the relative phase of the two arms "a", "b" of the laser beams does not change even if the optical path length to the FBGs 101a, 101b is changed. This means that thermal variations or small changes in one arm (i.e., arm "b", or arm "a") will not affect the phase of the beam (i.e., beam 106 or beam 107) it returns to the larger system. Operating at the short wavelength band edge of the FBG 101a, 101b is important to this phase property.

One of ordinary skill in the art would know that the embodiment shown in FIG. 1, could be made more complex with additional FBGs, mirrors, etc., without deviating from the principles described herein regarding the present invention.

Figure 2:
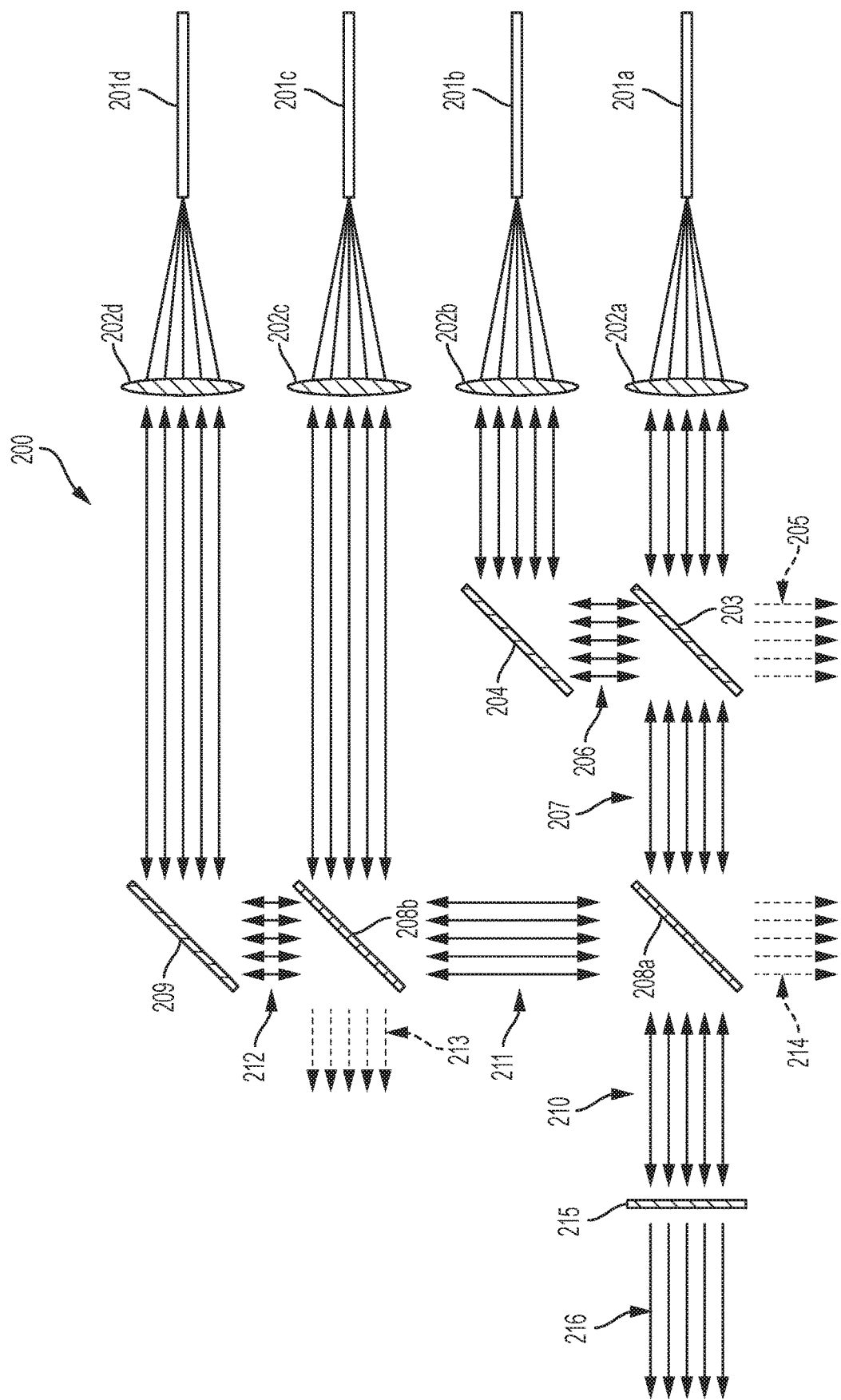
FIG. 2 shows a schematic drawing of a more complex interferometer configuration, according to one embodiment consistent with the present invention.

Thus, as shown in FIG. 2, a more complex embodiment includes, for example, an interferometer 200 having four FBGs, 201a-201d, where light beams therefrom pass through lenses 202a-202d. Light from lens 202a, which impacts 50% beam splitter 203, is transmitted as light beams 207.

The beams from lens 201b impact mirror 204, and are reflected towards beam splitter 203 as beams 206. The beams 206 are reflected at beam splitter 203 to join the beams from lens 202*a,* as a high output beam 207, and are not transmitted through beam splitter 203, due to destructive interference with the reflected beams from lens 202*a.* Thus, no net optical power is contained in beams 205.

This arrangement is similar to the configuration discussed above with respect to FIG. 1. However, instead of beams 207 impacting an output coupler, beams 207 impact another 50% beam splitter 208*a,* and a configuration of FBGs 201*c*-201*d,* which utilize 50% beam splitter 208*b* and mirror 209, respectively, to create additional power for beams 210, and after proceeding through output coupler 215, increased output power for beams 216.

As shown in the exemplary embodiment of FIG. 2, beams 212 from lens 202*d* are reflected by mirror 209 to beam splitter 208*b,* and are transmitted as beams 211 to impact beam splitter 208*a.* Reflected beams at beam splitter 208*b,* destructively interfere with transmitted beams from lens 202*c,* to not exit the array. Thus, there is no net optical power contained in beams 213.

Reflected beams from mirror 209 pass through beam splitter 208*b,* and join with reflected beams from lens 202*c,* to be reflected at beam splitter 208*a,* and join together with the beams from beam splitter 203, to form high output beam 210. Transmitted beams from beam splitter 208*b* pass through the beam splitter 208*a,* where destructive interference with reflected beams from beam splitter 203 results in no beams 214 exiting the array. Some of beams 210 pass though output coupler 215 and exit the array 200 as a single spatial mode beam of higher power 216, while some light is reflected from 215 and is circulated back into the interferometer.

Thus, as one of ordinary skill in the art would appreciate, the present invention can be used to split and combine/recombine beams in other laser, amplifier and passive configurations. Note that one of ordinary skill in the art would know that in the descriptions of these exemplary embodiments, substitute or additional gain sources (i.e., doped fibers, laser crystals, semiconductor diodes, etc.), or optical elements (i.e., mirrors, beam splitters, etc.), other than those described, may be added to achieve the desired purposes. Further, one of ordinary skill in the art would include the focal lengths, pitch dimensions, fiber numerical apertures and beam size, that are well-known to one of ordinary skill in the art.

Figure 3:
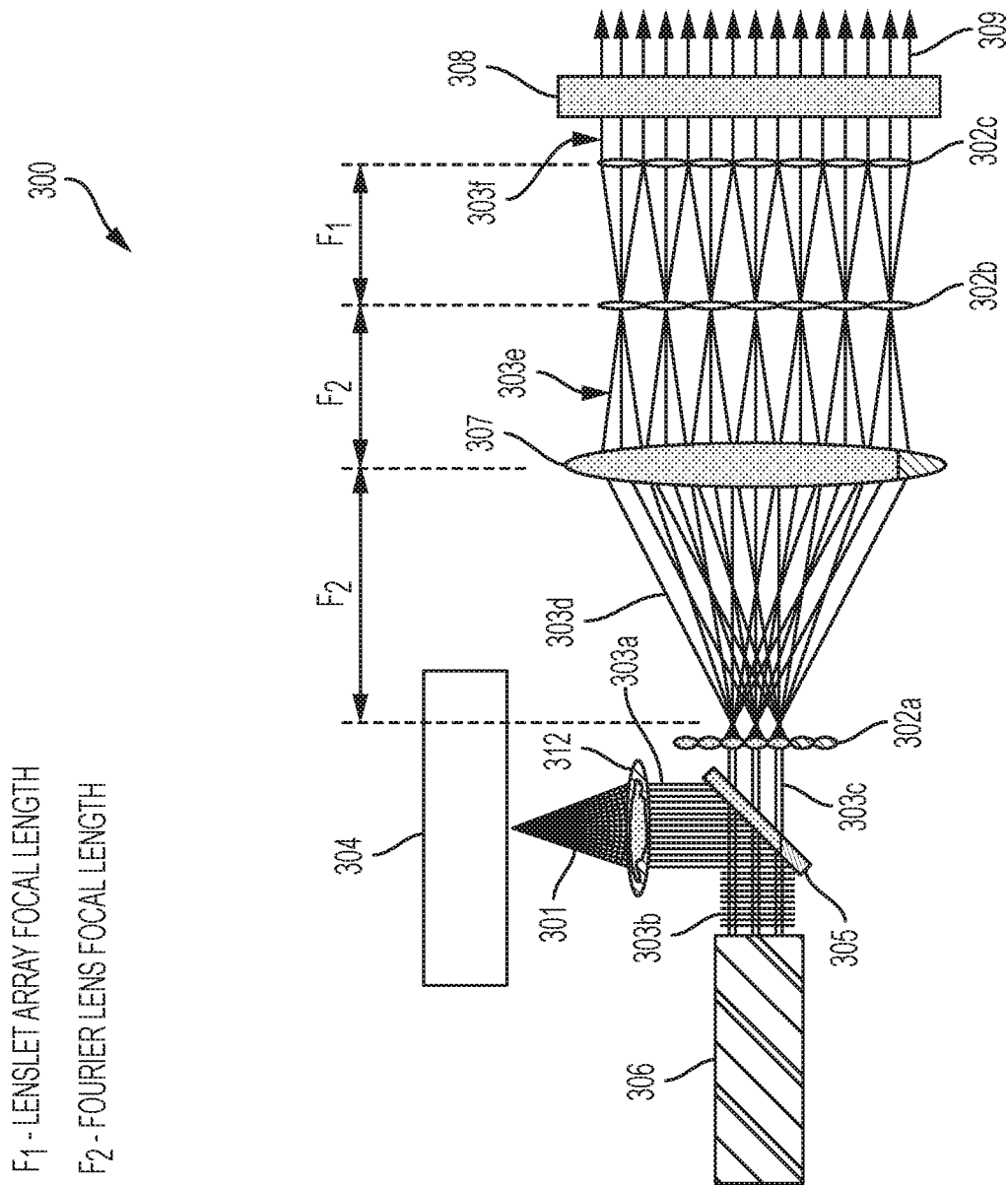
FIG. 3 shows a schematic drawing of a laser configuration, according to one embodiment consistent with the present invention.

In another exemplary embodiment of the present invention, as shown in FIG. 3, the present invention may include a laser configuration 300, which exhibits yet another way to arrange the beam splitting and recombination, and phase locking techniques. In this exemplary embodiment, the laser apparatus 300 includes a laser gain source 306, such as Yterrbium-doped glass with a volume Bragg grating (e.g., a photo-thermo-refractive (PTR) glass (i.e., optical quality silicate glass co-doped with Yterrbium)).

As shown in FIG. 3, the laser configuration 300 includes a pump diode laser 304 (e.g., pump wavelength of 975 nm), which transfers energy in the form of emitting beams of light 303*a* via lens 312, the beams 303*a* which impact a dichroic mirror 305, and where the beams 303*a* are reflected to the laser gain source 306. As shown in FIG. 3, the overall lasing cavity is between the high-reflecting volume Bragg grating in 306 and the output coupler 308.

In the exemplary embodiment as shown in FIG. 3, the lenslet array 302*a* (spacing between spots, about 1 mm) focuses the light beams 303*c,* and emits light beams 303*d* to a Fourier lens 307, which Fourier transforms the beams 303*d* and transmits them through the microlens arrays 302*b,* 302*c.* The light beams 303*f* exit the lenslet arrays 302*b,* 302*c* to output coupler 308. The beams 303*e* are formed into a single-mode output beam, as long as all the individual gain sources (i.e., laser gain material 306.) are in phase with one another. In one embodiment, the lenslet arrays 302*c,* 302*b* split the light from a single beam 303*e* into multiple beams 303*e* and to recombine the multiple beams back into a single beam 303*f.* This same function (of the lenslet array pair) could be accomplished with a diffractive optical element (DOE) in a different embodiment. The beams exiting the output coupler 308 form a single spatial mode, narrow frequency laser beam 309.

Figure 4:
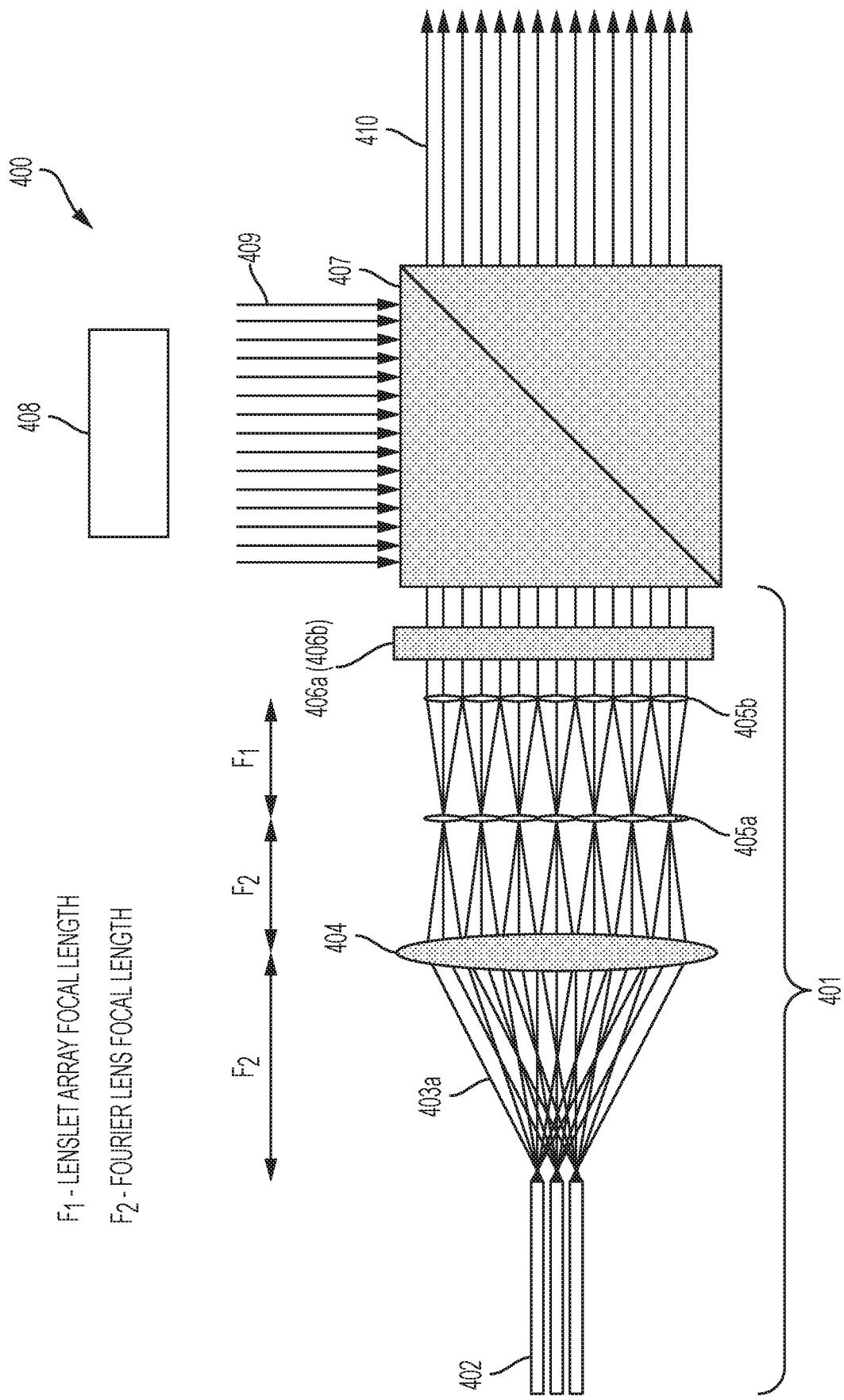
FIG. 4 shows a schematic drawing of an amplifier configuration, according to one embodiment consistent with the present invention.

In yet another exemplary embodiment, as shown in FIG. 4, an amplifier configuration 400 is shown, which operates generally the same as the configuration in FIG. 3. In this exemplary embodiment, the laser apparatus 401 includes a gain source 402, such as a single mode, multiple ytterbium (Yb)-doped gain fibers with integrated fiber Bragg gratings (FBGs). In one exemplary embodiment, an anti-reflection coating is applied to the front facets of the fibers 402, which are mounted in an array configuration.

As shown in FIG. 4, the light beams 403*a* from FBG 402 pass through Fourier lens 404, and through lenslet arrays 405*a,* 405*b,* to output coupler 406*a.* Output coupler 406*a* can be a partially reflecting mirror, or in another embodiment, could be a volume Bragg grating in which the peak reflection matches the short wavelength band edge of the FBGs 402 so the preferred wavelength for phase-locking is reinforced by the output coupler 406*a* reflection.

In an amplifier arrangement, the output coupler 406*a* is replaced by Faraday rotator 406*b,* and the beams 409 from laser source 408 are reflected by polarizer 407, pass though the optical elements (lenslet arrays 405*a,* 405*b* etc.) into fibers 202, are reflected by the FBGs 402, and form a single spatial mode, narrow frequency laser beam 410.

Thus, in one exemplary embodiment, the Bragg reflector (i.e., FBGs 402) enables passive phase-locking of multiple sources, instead of current techniques which require very complicated, active control of the optical phase. Rather, in current technology, phase-locking multiple sources to each other at optical frequencies is complex and relatively unstable, and the degree of difficulty increases nonlinearly with the number of sources. However, the present invention, utilizing a reflection from Bragg grating reflectors 402 at the short wavelength band edge, reflect light with a fixed phase relationship to the input light 409 independent of the optical path length of the reflector 402 from the light source 408. This unique property of the present invention means that multiple sources can be passively self-phase-locked to each other, removing the most challenging part of the beam combination.

Further, since, in general, very small perturbations in temperature or alignment would be enough to alter the optical phase characteristics of alternate designs, locking all the phases together needs active control. The unique property of using the FBG reflections at the short wavelength band edge is that it returns a phase relative to the incident phase irrespective of the optical path length. This means that as the laser power is building up, all the phases from the various fibers (gain sources) will lock to each other as they mix from the feedback of a common output coupler. This architecture of the present invention provides a novel distributed-gain laser cavity that can make dramatic improvements in laser performance and flexibility.

Figure 5:
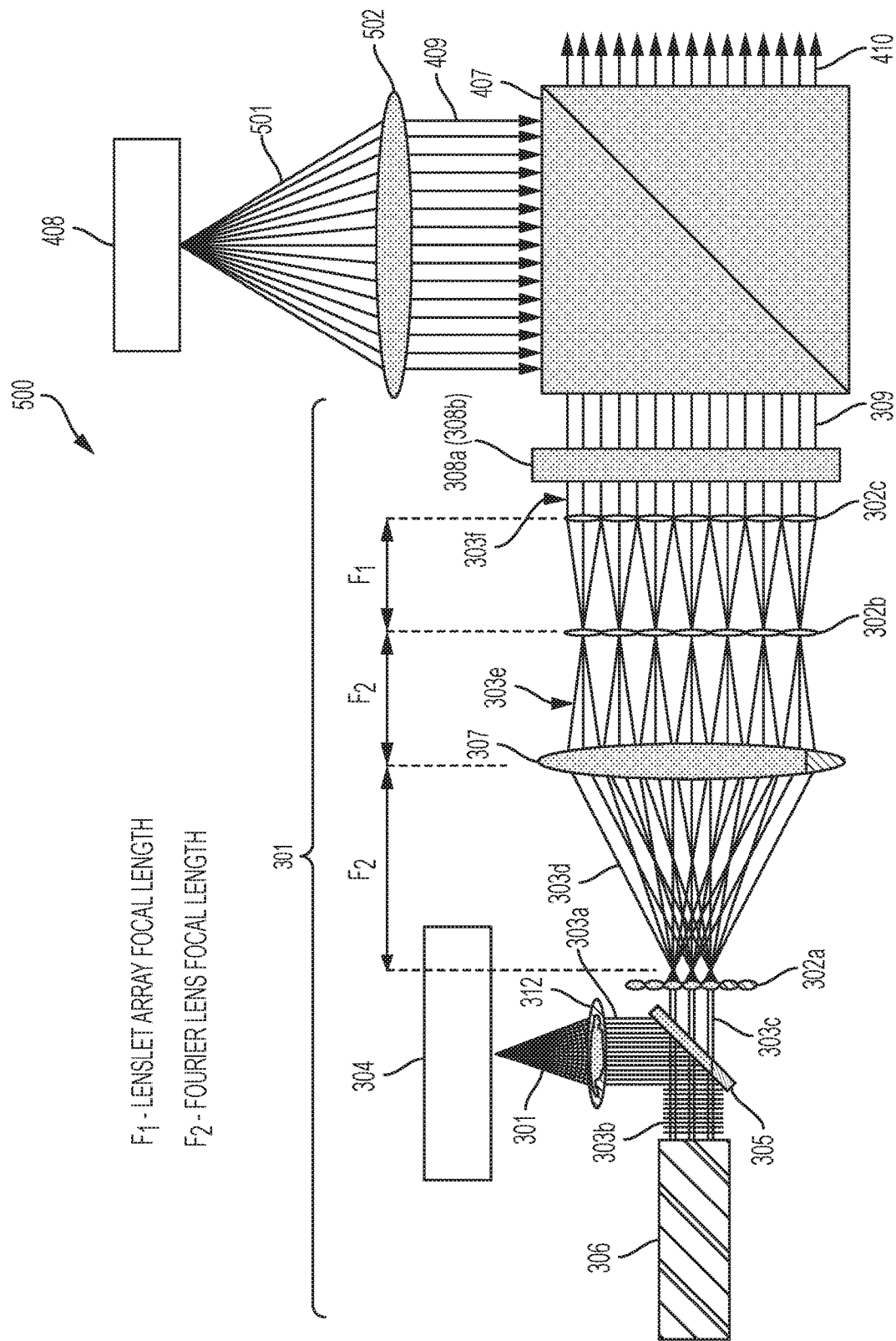
FIG. 5 shows a schematic drawing of yet another amplifier configuration, according to one embodiment consistent with the present invention.

In yet another exemplary embodiment, FIG. 5 shows an amplifier configuration 500 which embodies elements of FIG. 3 and FIG. 4. Like reference numerals represent like elements.

In this embodiment, there are pump laser 304 and seed laser 408, and the beams from seed laser 408 emits beams 501 through lens 502, to polarizer 407, where it joins with beams 309 reflected from gain source 306, to emit a high output laser beam 410. In the amplifier configuration, the output coupler 308a is replaced by a Faraday rotator 308b, which transmits light 309 towards the polarizer 407. (The combination of the Faraday rotator 308b and polarizer 407 functions as an optical circulator and separates the amplified return signal 410 (i.e., signal wavelength 1030 nm) from the seed input signal 409).

Thus, the exemplary embodiment of FIG. 5 shows that spatially distributed gain sources, meaning a 1-dimensional (1-D) or 2-D array of optical gain elements, can be combined into a single spatial mode, narrow frequency laser beam 410.

Figure 6:
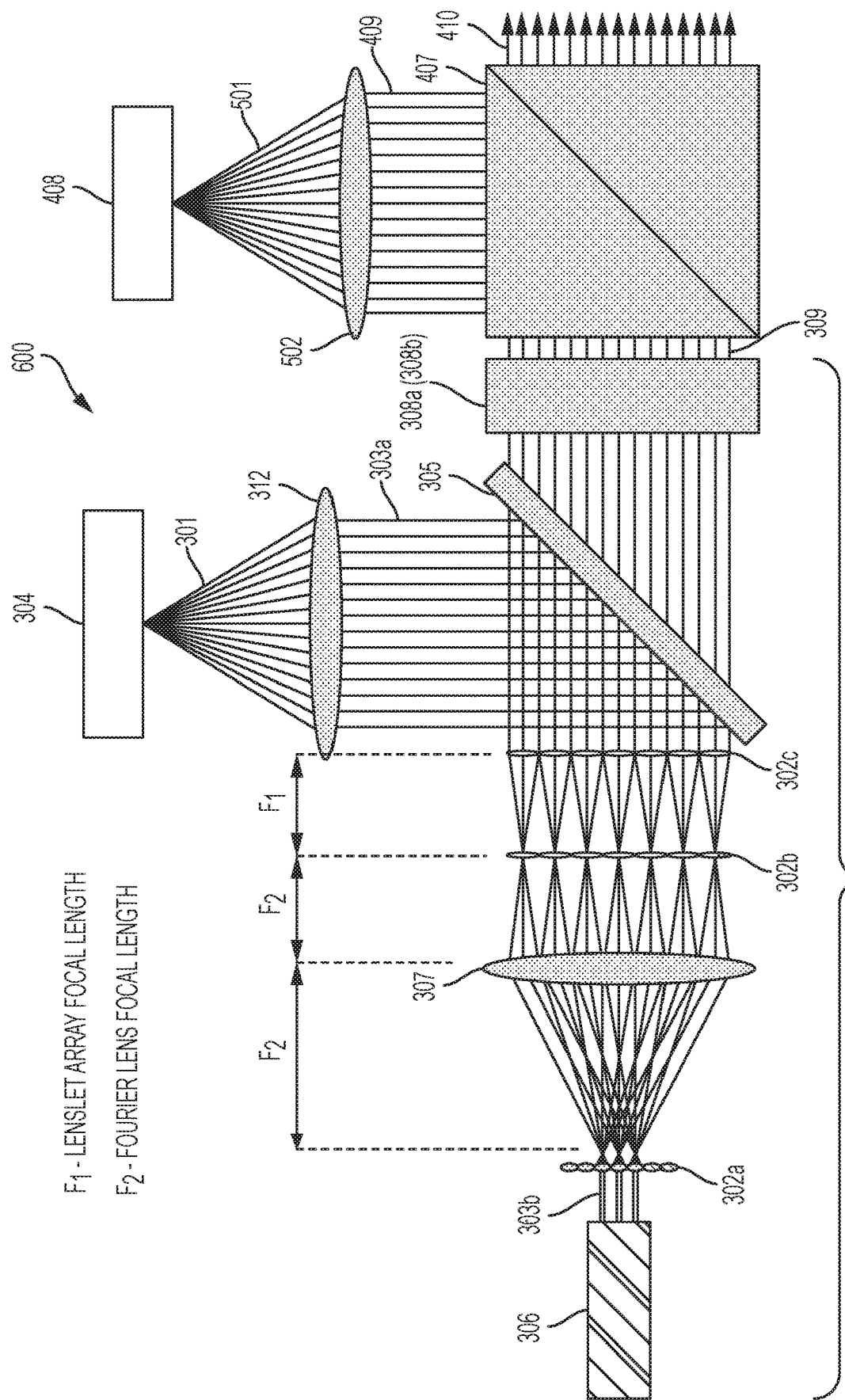
FIG. 6 shows a schematic drawing of yet another amplifier configuration, according to one embodiment consistent with the present invention.

In yet another exemplary embodiment showing that the beam splitting and recombination elements can be arranged in various ways, FIG. 6 depicts another amplifier configuration 600, where like reference numerals indicate like elements of FIG. 5.

In the exemplary embodiment of FIG. 6, in contrast to the configuration of FIG. 5, the pump laser 304, emits beams 301 through lens 312, which beams 303a impact dichroic mirror 305 which is disposed between lenslet array 302c and Faraday rotator 308b. The other elements are the same, and the same high-power output, of a single spatial mode, narrow frequency laser beam 410, can be achieved.

Thus, one of ordinary skill in the art would recognize that there are various arrangements and configurations where one can achieve the claimed features of the present invention by combining the techniques of beam splitting and recombination, and phase-locking (i.e., maintaining a common phase relationship between multiple beams), using reflective gratings.

In other embodiments, because of the unique beam combination of the present invention that allows many beams of light to be combined into one, single spatial mode beam, traditional laser components, like Q-switches, that enable specialized performance, can be used. For example, these components would be used in the section of the laser cavity between the output coupler and the second lens array (see FIG. 3, for example), where the beams have already been combined. The beams of light from each fiber of the FGBs, is distributed across all lenses in the array (i.e., Fourier lens, lenslet arrays), so that the feedback from the output coupler mixes light beams between all the fibers (FBGs). The light beams must be mutually coherent (i.e., phase-locked) so that the beams of light do not create destructive interference patterns.

The present invention can be used with high power, high efficiency, flexible laser sources. With the demonstration of an effective energy combination from multiple fibers, this technique can be generalized to both solid-state and diode sources. The ability to combine semiconductor lasers is particularly important because they have the highest efficiency and very nearly continuous wavelength coverage from the visible to the mid-infrared (IR).

The present invention can be used to power scale the output for semiconductor lasers, which can directly combine the energies from arrays of semiconductors, to provide a significant advantage in applications where existing laser technologies have been unable to achieve the required power or efficiency at the desired wavelength.

The present invention could, therefore, include semiconductor laser arrays with reflective gratings grown in the semiconductor material, which could be fabricated all on the same wafer, and the cost and manufacturability of the same would be a vast improvement over currently-available systems. This type of multi-element manufacturing is already produced for laser diode arrays used for solid-state pumping, but the output with the present invention could now be single spatial mode through phase-locking, which would significantly improve performance.

It should be emphasized that the above-described embodiments of the invention are merely possible examples of implementations set forth for a clear understanding of the principles of the invention. Variations and modifications may be made to the above-described embodiments of the invention without departing from the spirit and principles of the invention. All such modifications and variations are intended to be included herein within the scope of the invention and protected by the following claims.

What is claimed is:

1. An optical apparatus comprising:
   at least one energy source which emits a plurality of beams of light;
   at least one gain source and a reflective grating, said reflective grating which maintains a fixed phase relationship between said plurality of beams of light; and
   a plurality of optical elements which split said plurality of beams of light from said at least one reflective grating and recombine said plurality of beams of light, into a single spatial mode output laser beam;
   wherein said at least one reflective grating reflects said plurality of beams of light with said fixed phase relationship to said plurality of beams of light input from said at least one energy source, independent of a distance of said at least one reflective grating from said at least one energy source.

2. The optical apparatus of claim 1, wherein said at least one reflective grating comprises one of a volume Bragg grating recorded in a photo-thermo-refractive (PTR) glass, or a plurality of ytterbium (Yb)-doped gain fibers with integrated fiber Bragg gratings (FBGs), or at least one semiconductor diode with said reflective grating.

3. The optical apparatus of claim 2, further comprising:
   at least one array of lenslets which allows said plurality of beams of light from said reflective grating to be split and phase-locked.

4. The optical apparatus of claim 3, wherein said at least one array of lenslets are one dimensional or two dimensional in configuration.

5. The optical apparatus of claim 1, wherein said apparatus is a laser apparatus and said plurality of optical elements includes an output coupler.

6. The optical apparatus of claim 1, wherein said apparatus is an amplifier apparatus and said plurality of optical elements includes a Faraday rotator and a polarizer.

7. The optical apparatus of claim 5, wherein said energy source is a pump laser.

8. The optical apparatus of claim 7, further comprising a seed laser which provides energy to said polarizer.

9. A method of increasing an output of a laser beam, comprising:
   emitting a plurality of laser beams of light from at least one energy source;
   maintaining a fixed phase relationship between said plurality of beams of light using at least one gain source and a reflective grating; and
   splitting said plurality of beams of light from said at least one reflective grating and recombining said plurality of beams of light using a plurality of optical elements, into a single spatial mode output laser beam;

wherein said at least one reflective grating reflects said plurality of beams of light with said fixed phase relationship to said plurality of beams of light input from said at least one energy source, independent of a distance of said at least one reflective grating from said at least one energy source.

10. The method of claim 9, wherein said at least one reflective grating comprises one of a volume Bragg grating recorded in a photo-thermo-refractive (PTR) glass, or a plurality of ytterbium (Yb)-doped gain fibers with integrated fiber Bragg gratings (FBGs) or at least one semiconductor diode with said reflective grating.

11. The method of claim 10, further comprising:
splitting and phase-locking said plurality of beams of light from said at least one reflective grating, using at least one array of lenslets.

12. The method of claim 11, wherein said at least one array of lenslets are one dimensional or two dimensional in configuration.

13. The method of claim 9, wherein said plurality of optical elements includes an output coupler of a laser apparatus.

14. The method of claim 9, wherein said plurality of optical elements includes a Faraday rotator and a polarizer of an amplifier apparatus.

15. The method of claim 13, wherein said energy source is a pump laser.

16. The method of claim 15, further comprising:
providing energy to said polarizer using a seed laser.

* * * * *